United States Patent [19]

Jones, Jr.

[11] Patent Number: 5,567,636
[45] Date of Patent: Oct. 22, 1996

[54] PROCESS FOR FORMING A NONVOLATILE RANDOM ACCESS MEMORY ARRAY

[75] Inventor: Robert E. Jones, Jr., Austin, Tex.

[73] Assignee: Motorola Inc., Schaumburg, Ill.

[21] Appl. No.: 395,132

[22] Filed: Feb. 27, 1995

[51] Int. Cl.$^6$ ............................................. H01L 21/8242
[52] U.S. Cl. ................... 437/43; 437/60; 437/195
[58] Field of Search ................. 437/43, 47, 48, 437/60, 195

[56] References Cited

U.S. PATENT DOCUMENTS

| | | | |
|---|---|---|---|
| 4,982,309 | 1/1991 | Shepherd | 361/221 |
| 5,081,559 | 1/1992 | Fazan et al. | 361/313 |
| 5,119,154 | 6/1992 | Gnadinger | 257/295 |
| 5,290,725 | 3/1994 | Tanaka et al. | 437/43 |
| 5,300,799 | 4/1994 | Nakamura et al. | 257/295 |
| 5,329,486 | 7/1994 | Lage | 365/145 |
| 5,373,463 | 12/1994 | Jones, Jr. | 365/145 |
| 5,389,567 | 2/1995 | Acovic et al. | 437/43 |
| 5,439,840 | 8/1995 | Jones, Jr. et al. | 437/60 |

Primary Examiner—Chandra Chaudhari
Attorney, Agent, or Firm—George R. Meyer

[57] ABSTRACT

An NVRAM array (30) has a portion (31) associated with a drive line segment ($DSL_{11}$). The drive line segment ($DSL_{11}$) is coupled to a drive line (DL1) by a control transistor (32). The layout allows a conductive member (112) that is part of lo the drive line segment ($DSL_{11}$) to be formed at about the same elevation as the memory capacitors (118). The layout further allows interconnects (136) for the drive lines (DL1, $DL_2$) and bit lines ($BL_{11}$, $BL_{12}$, $BL_{13}$, $BL_{14}$) to be formed over the control and memory transistors (32, 34), as opposed to between the transistors. The process forms a small and reliable NVRAM device.

19 Claims, 10 Drawing Sheets

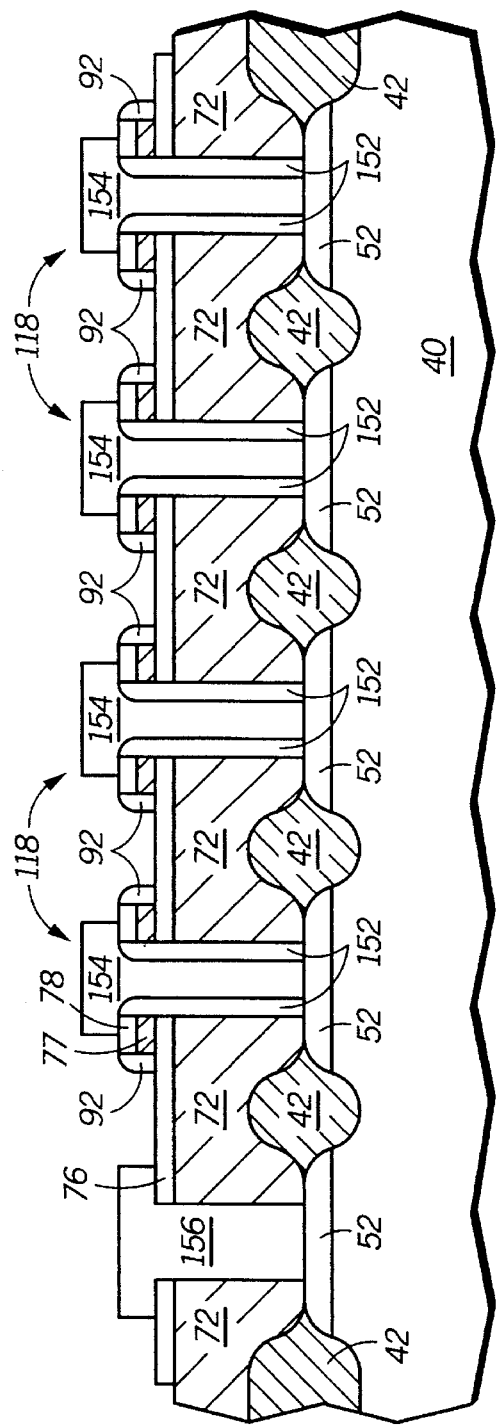
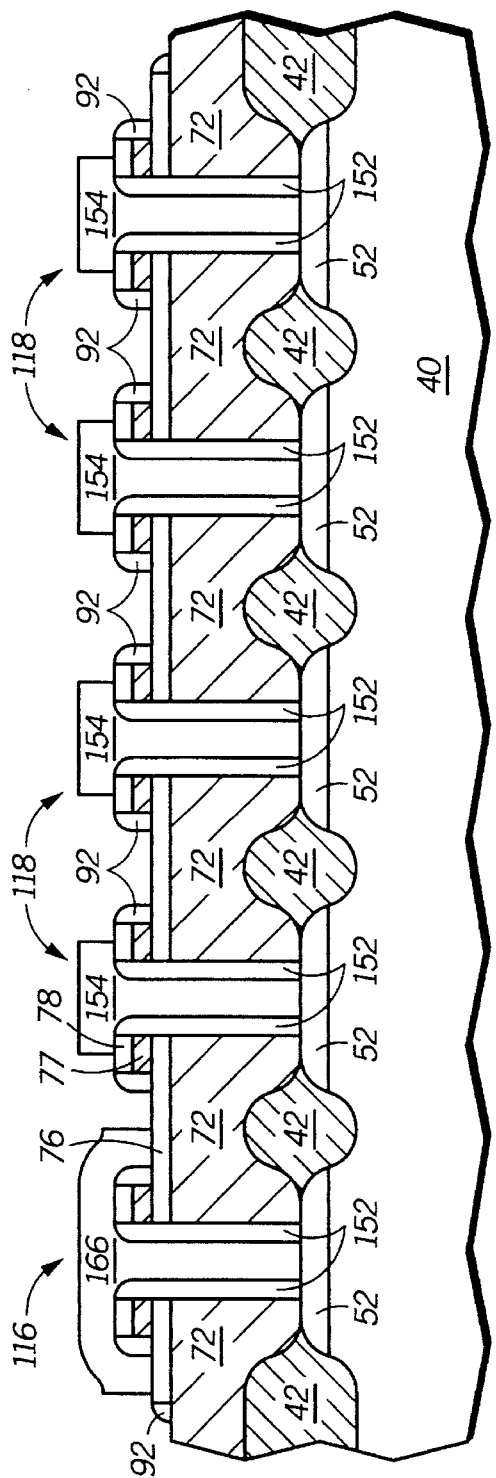

5,567,636

PROCESS FOR FORMING A NONVOLATILE RANDOM ACCESS MEMORY ARRAY

FIELD OF THE INVENTION

The present invention relates to semiconductor devices, and in particular, to nonvolatile random access memories.

BACKGROUND OF THE INVENTION

FIG. 1 includes a circuit diagram of a nonvolatile random access memory cell 1. The memory cell 1 includes a ferroelectric capacitor 2 and an n-channel metal-oxide-semiconductor field-effect transistor (MOSFET) 3. The gate of the MOSFET 3 is coupled to word line WL. A source/drain region of MOSFET 3 is coupled to bit line BL. One electrode of the ferroelectric capacitor 2 is coupled to the other source/drain region of MOSFET 3 and the other electrode of ferroelectric capacitor 2 is coupled to drive line DL. Memory cell 1 is an example of a one transistor, one capacitor NVRAM cell. In other embodiments, NVRAM cells include two transistors and one ferroelectric capacitor or four transistors and two ferroelectric capacitors. For the two and four transistor NVRAMs, equal numbers of p-channel and n-channel transistors are used. These other memory cells are known to those skilled in the art.

FIG. 2 includes a plan view of one type of NVRAM cell 1. The plan view of NVRAM cell 20 includes an interconnect 21 that is the bit line, a polysilicon conductive member 22 that is a word line, an active region 23, a conductive strap 24, a ferroelectric capacitor 25, and a drive line 26. Field isolation region 28 lies everywhere outside the active region 23. The interconnect 21, polysilicon conductive member 22, conductive strap 24, ferroelectric capacitor 25, and drive line 26 overlie the field isolation region 28. The interconnect 21 and conductive strap 24 are formed from the same layer. Therefore, the bit line cannot be formed over the ferroelectric capacitor 25, and the memory cell tends to be relatively large.

In conventional NVRAMs, the drive line is typically connected to a row or column of ferroelectric capacitors similar to the capacitor 2 as shown in FIG. 1. The drive line may be electrically connected to a thousand ferroelectric capacitors that lie along that row or a column. When accessing any of the memory cells along the drive line, all ferroelectric capacitors along that row or column are affected.

A problem with ferroelectric capacitors within NVRAMs is that they suffer from a problem called "fatigue." After the potential on a ferroelectric capacitor has been switched millions of times, eventually the ferroelectric capacitor cannot hold a remanent polarization necessary for an NVRAM cell. In such a case, the memory cell is no longer functional as an NVRAM cell.

BRIEF DESCRIPTION OF THE DRAWINGS

The present invention is illustrated by way of example and not limitation in the figures of the accompanying drawings, in which like references indicate similar elements, and in which:

FIGS. 15–17 include illustrations of cross-sectional views of other embodiments.

DETAILED DESCRIPTION

A nonvolatile random access memory (NVRAM) array is particularly useful with stacked capacitor and space efficient capacitor types of NVRAM cells. A conductive member that is the drive line segment is formed over a source/drain region of a control transistor. Interconnects for the drive lines and bit lines are formed over the control and memory transistors, as opposed to between the transistors. The process allows a small and reliable NVRAM to be formed. The present invention is better understood with the embodiments described below.

An Embodiment

Figure 3:
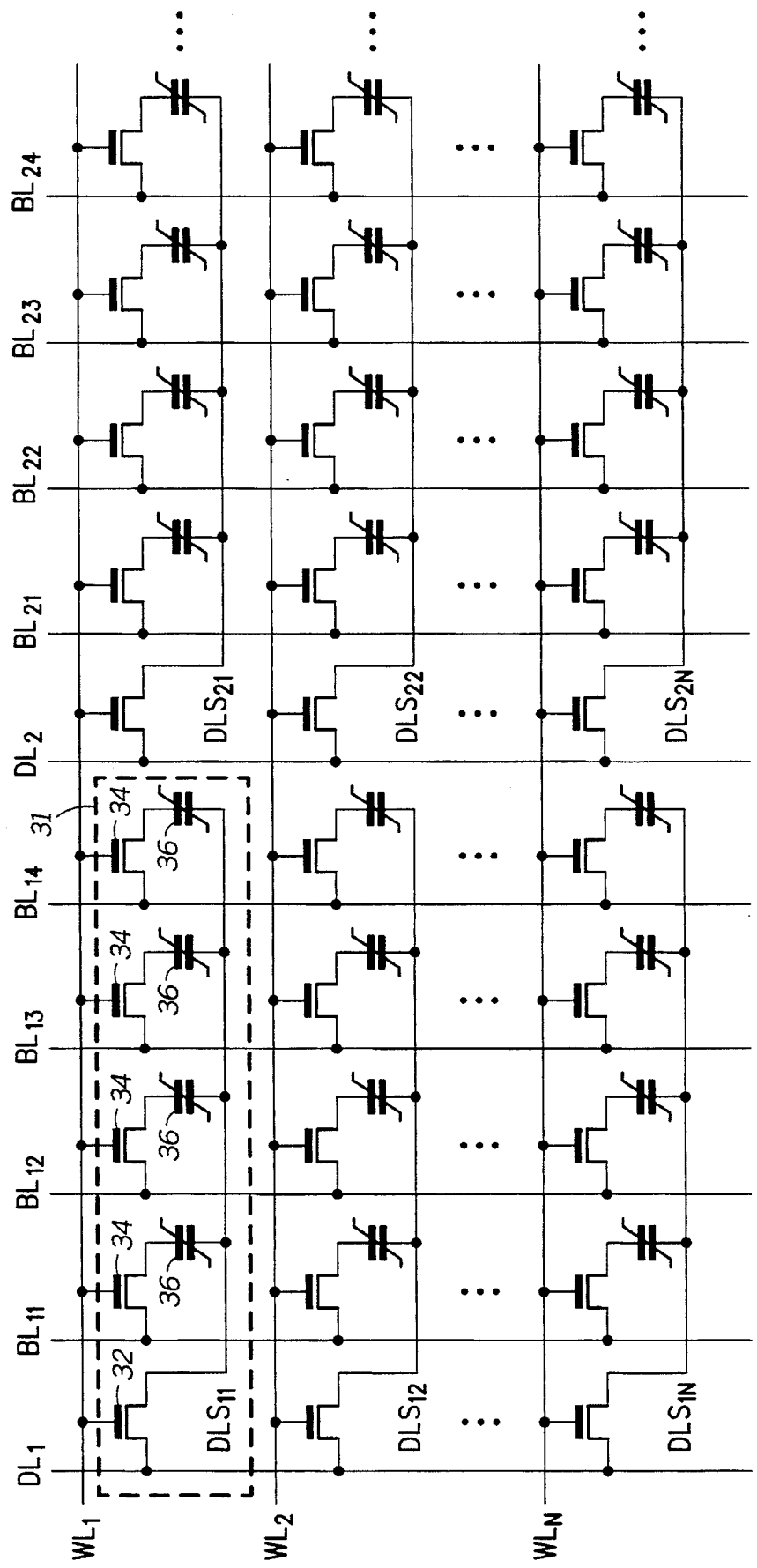
FIG. 3 includes an illustration of a circuit diagram of a nonvolatile random access memory.

FIG. 3 includes an illustration of a circuit diagram of an NVRAM array 30 that has a "×4" type of memory architecture. The "×4" memory architecture means that the word length is four bits (four memory cells) long. If the NVRAM array 30 has about 1 megabits (Mb) of memory cells, the NVRAM array 30 would be organized to have a 256 kilobits (Kb) by four (256 Kb×4) organization. Other organizations including ×8, ×9, ×16, ×18, ×32, or the like are also possible memory architectures. As seen in FIG. 3 there are drive lines $DL_1$, $DL_2$; bit lines $BL_{11}$, $BL_{12}$, $BL_{13}$, $BL_{14}$, $BL_{21}$, $BL_{22}$, $BL_{23}$, $BL_{24}$; and word lines $WL_1$, $WL_2$, and $WL_N$. Other drive lines, bit lines and word lines are included within the memory array 30 but are not shown.

Each drive line has drive line segments that correspond to the word length. Because the NVRAM array 30 has a "×4" organization, each drive line segment is common to only four memory cells. Referring to FIG. 3, $DL_1$ is electrically coupled to drive line segments $DLS_{11}$, $DLS_{12}$, ..., $DLS_{1N}$, and $DL_2$ is electrically coupled to drive line segments $DLS_{21}$, $DLS_{22}$, ..., $DLS_{2N}$. Each drive line segment is electrically connected to only four ferroelectric capacitors. If each NVRAM cell includes four transistors and two ferroelectric capacitors, the drive line segment would be electrically connected to only eight ferroelectric capacitors in a ×4 organization.

Within NVRAM array 30, portion 31 generally corresponds to NVRAM cells associated with $DLS_{11}$. Within portion 31 is a control transistor 32, memory transistors 34 and ferroelectric capacitors 36. Each memory cell includes one transistor 34 and its corresponding ferroelectric capacitor 36.

The control transistors are used to determine which drive line segments are active. Referring to portion 31, a source/drain region of transistor 32 is electrically connected to $DL_1$, and the other source/drain region of transistor 32 is electrically connected to the $DLS_{11}$. When control transistor 32 is on, $DLS_{11}$ has about the same potential as $DL_1$. When control transistor 32 is off, $DLS_{11}$ is electrically disconnected from $DL_1$. The potential on $WL_1$ determines whether $DLS_{11}$ is on or off.

For the memory cells, a source/drain region of transistor 34 is electrically connected to one of the bit lines, $BL_{11}$, $BL_{12}$, $BL_{13}$, $BL_{14}$, and the other source/drain region of transistor 34 is electrically connected to one of the electrodes of ferroelectric capacitor 36. The other electrode of the ferroelectric capacitor 36 is electrically connected to the $DLS_{11}$. Unlike conventional ferroelectric random access memories (FERAMs), a drive line is not electrically connected to a thousand ferroelectric capacitors. $DLS_{11}$ is only electrically connected to the four ferroelectric capacitors 36 within portion 31.

Figure 4:
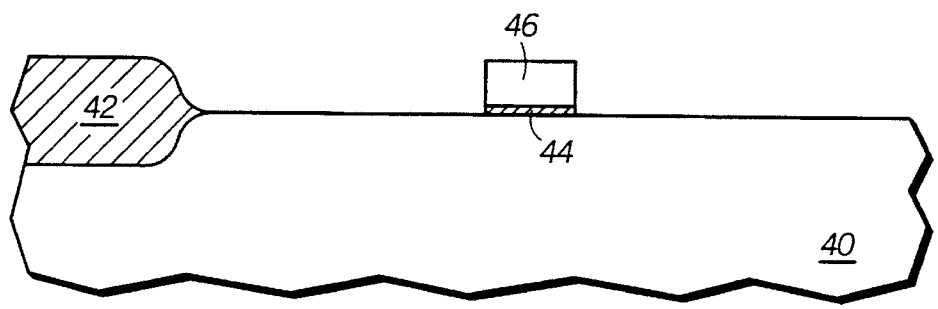
FIG. 4 includes an illustration of a cross-sectional view of a portion of a semiconductor substrate after forming a polysilicon conductive member.

Attention is now directed toward the fabrication of NVRAM array 30 including portion 31. FIG. 4 includes an illustration of a cross-sectional view of a portion of a semiconductor substrate 40, such as a p-type monocrystalline silicon substrate. A field isolation region 42 is formed over a portion of substrate 40, and a gate dielectric layer 44 and a conductive member 46 are formed over another portion of the substrate 40.

Figure 5:
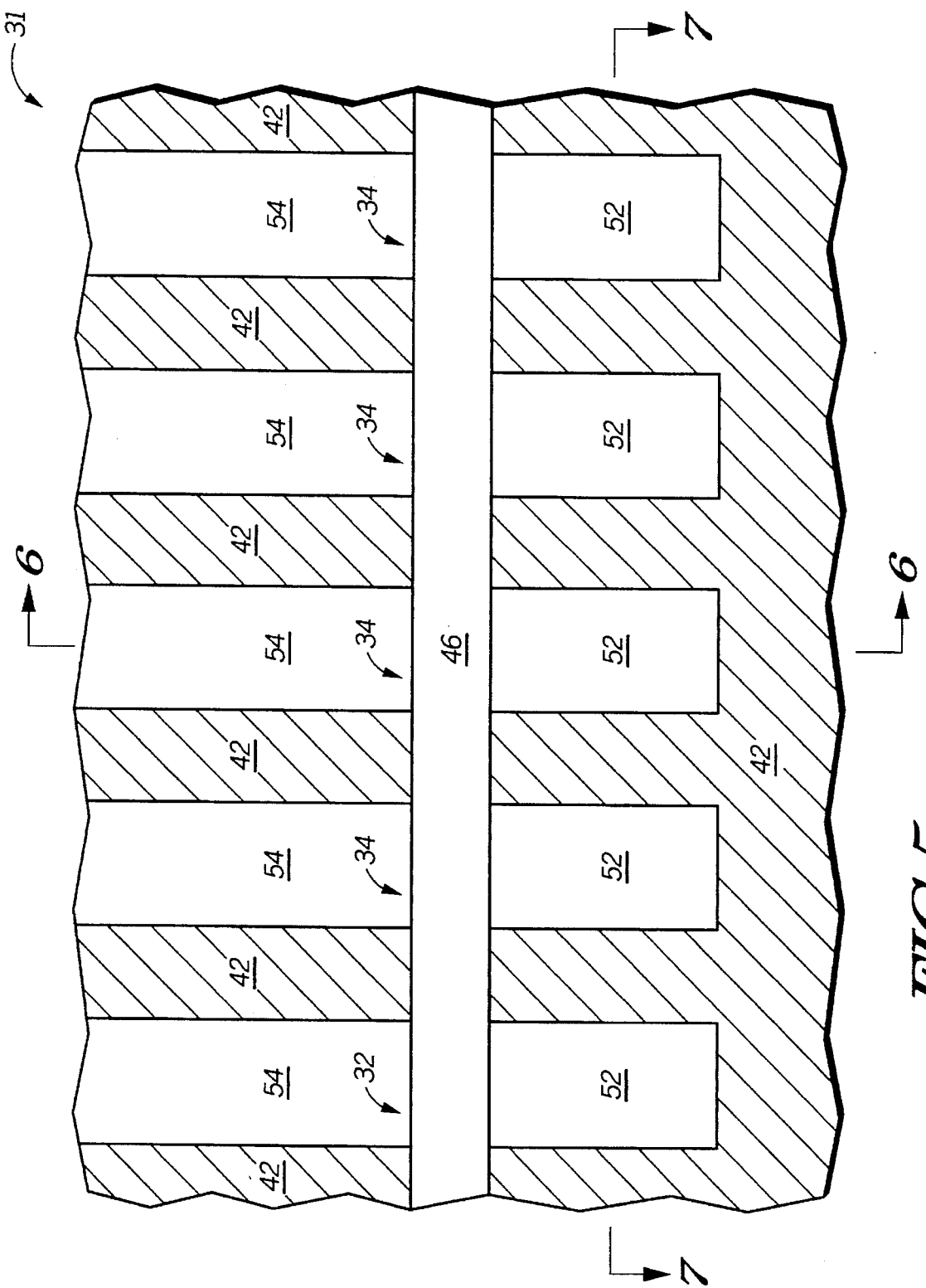
FIGS. 5 and 6 include plan and cross-sectional views, respectively, of the substrate of FIG. 4 after forming source/drain regions.
Figure 6:
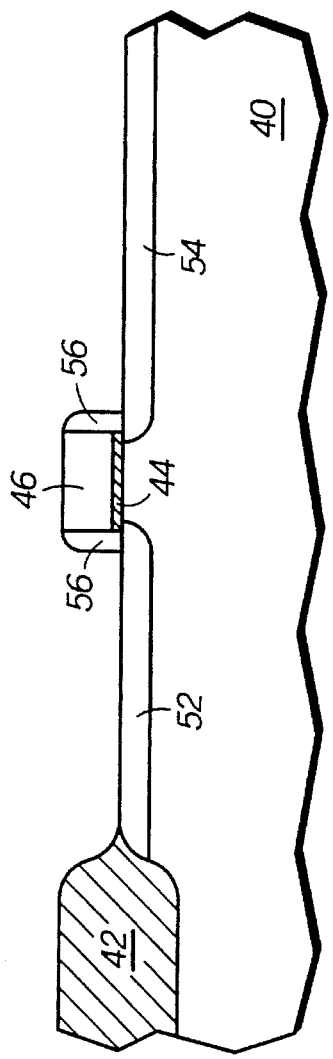

Exposed portions of substrate 40 are doped to form source/drain regions 52 and 54 as shown in FIGS. 5 and 6. FIG. 5 includes an illustration of a plan view of the portion 31 at this point in processing. FIG. 5 does not include illustrations of sidewall spacers to show more clearly the positional relationships between the various parts of portion 31. In FIG. 5, the field isolation region 42 is shown by hatched lines.

The conductive member 46 is a word line that extends beyond the edges of FIG. 5 and is typically connected to other transistors along the same word line. Source/drain regions 54 are locations to which drive line and bit line connections are subsequently formed. Source/drain regions 52 are locations over which ferroelectric capacitors are subsequently formed. The control transistor 32 and memory transistors 34 correspond to locations where the conductive member 46 crosses a portion of the substrate 40 that is not covered by the field isolation region 42. The channel regions of the transistors 32 and 34 lie beneath the conductive member 46.

FIG. 6 includes an illustration of a cross-sectional view at the sectioning lines 6—6 in FIG. 5. Source/drain regions 52 and 54 and sidewall spacers 56 are seen in FIG. 6. Source/drain regions 52 and 54 include an n-type dopant at a dopant concentration of at least 1E19 atoms per cubic centimeter. The dopant used to form the source/drain regions 52 and 54 includes phosphorus, arsenic, or the like.

Figure 7:
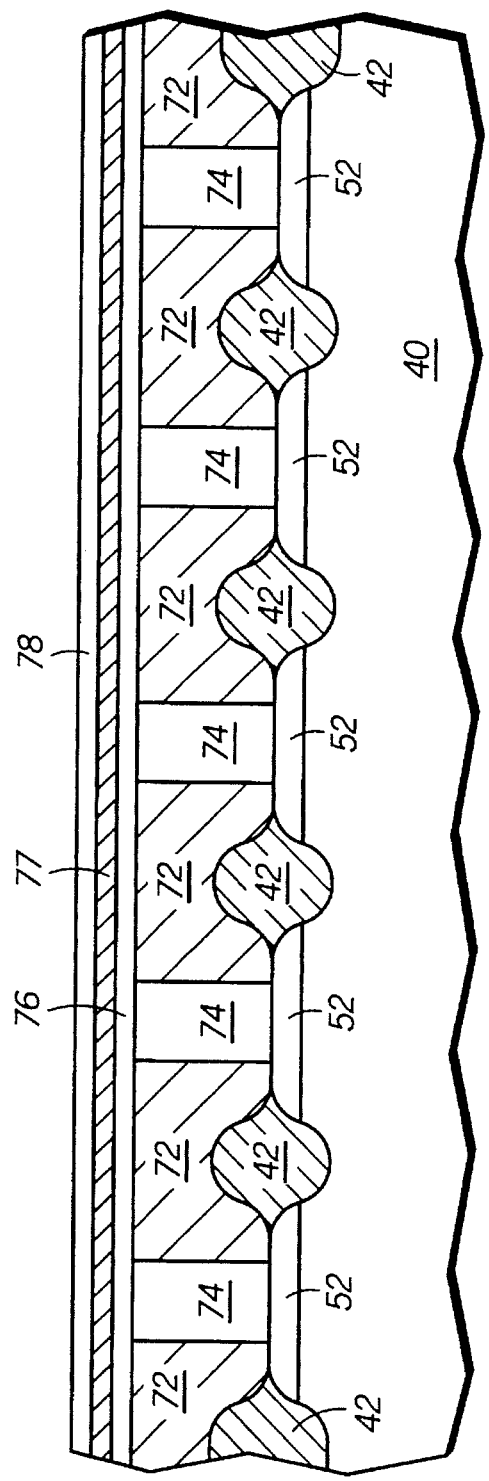
FIG. 7 includes an illustration of a cross-sectional view of the substrate of FIG. 6 after forming the layers for ferroelectric capacitors.

An insulating layer 72 is formed over the substrate 40 and is patterned to form openings that are filled with conductive plugs 74 that overlie source/drain region 52 as shown in FIG. 7. A conductive layer 76, a ferroelectric dielectric layer 77, and a conductive layer 78 are subsequently formed over the insulating layer 72 and conductive plugs 74.

The conductive plugs 74 remain conductive during an oxidation cycle used to change the ferroelectric dielectric layer 77 into its perovskite state. If the conductive plugs include silicon, a titanium nitride, tantalum nitride, or tungsten nitride is used to encapsulate the silicon. In this embodiment, the oxidation cycle does not oxidize the silicon within the conductive plugs 74 because the oxygen does not readily diffuse through nitride.

In an alternate embodiment, conductive plugs 74 include a metal and its conductive metal oxide, such as ruthenium and ruthenium dioxide. Other metals that have conductive metal oxides include rhenium, osmium, and iridium. A glue or barrier layer can be formed within the openings of insulating layer 72 before filling the openings with a material to form the conductive plugs.

The ferroelectric dielectric layer 77 includes bismuth strontium tantalate ($Bi_2SrTa_2O_9$), lead zirconate titanate (PZT), barium titanate, or the like. The material used for ferroelectric dielectric layer 77 must be capable of being converted to its perovskite state. Selection of materials for conductive layers 76 and 78 typically depend on the material selected for the ferroelectric dielectric layer 77. Conductive layer 76 must be capable of withstanding the oxidation cycle used to convert the ferroelectric dielectric layer 77 to its perovskite state without becoming too resistive. If the conductive layer 78 is formed after the ferroelectric layer 77 has been oxidized, then the conductive layer 78 includes virtually any metal-containing material. However, if additional oxygen anneals are used after conductive layer 78 is deposited, then conductive layer 78 must be capable of withstanding the oxygen anneal without becoming too resistive. Platinum is an example of a metal-containing material that can withstand oxygen anneals.

Figure 8:
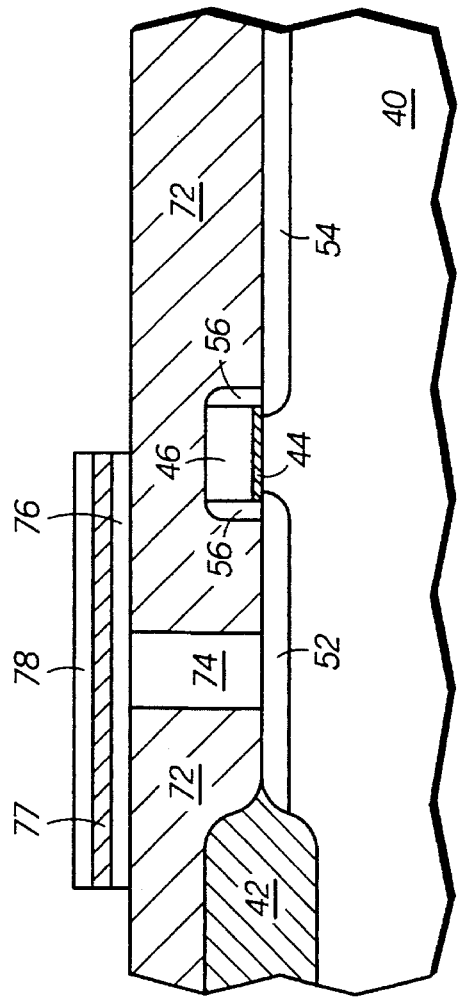
FIG. 8 includes an illustration of a cross-sectional view of the substrate of FIG. 7 after patterning the layers for the ferroelectric capacitors.
Figure 9:
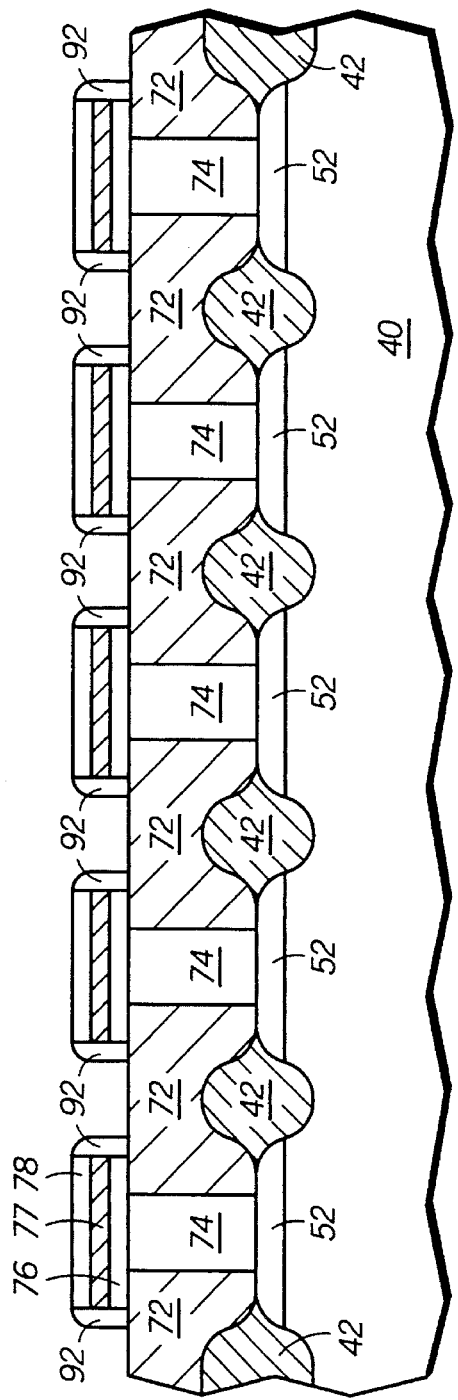
FIG. 9 includes an illustration of a cross-sectional view of the substrate of FIG. 8 after forming spacers.

The layers are patterned to form a structure as shown in FIG. 8 to form members 76–78. The patterning is performed using electron cyclotron resonance, plasma etching, or ion milling. The sides of the three layers are generally coincident with each other. As can be seen in FIG. 8, the structure overlies the source/drain region 52 and at least a portion of conductive member 46. Spacers 92 are then formed adjacent to the members 76–78 as shown in FIG. 9. Spacers 92 include an insulating material.

Figure 10:
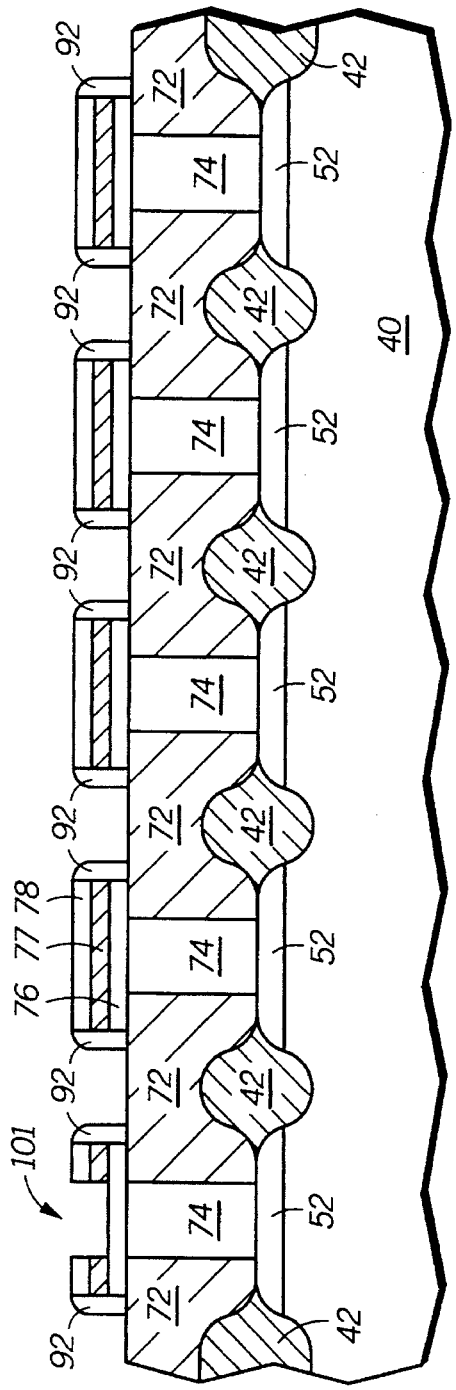
FIG. 10 includes an illustration of cross-sectional view of the substrate of FIG. 9 after forming an opening through the ferroelectric layer of one of the structures.

The left most structure is patterned to remove a portion of members 77 and 78 to form an opening 101 as shown in FIG. 10. Alternatively, the patterning could be performed to also remove member 76, in which case, conductive plug 74 would be exposed.

Figure 11:
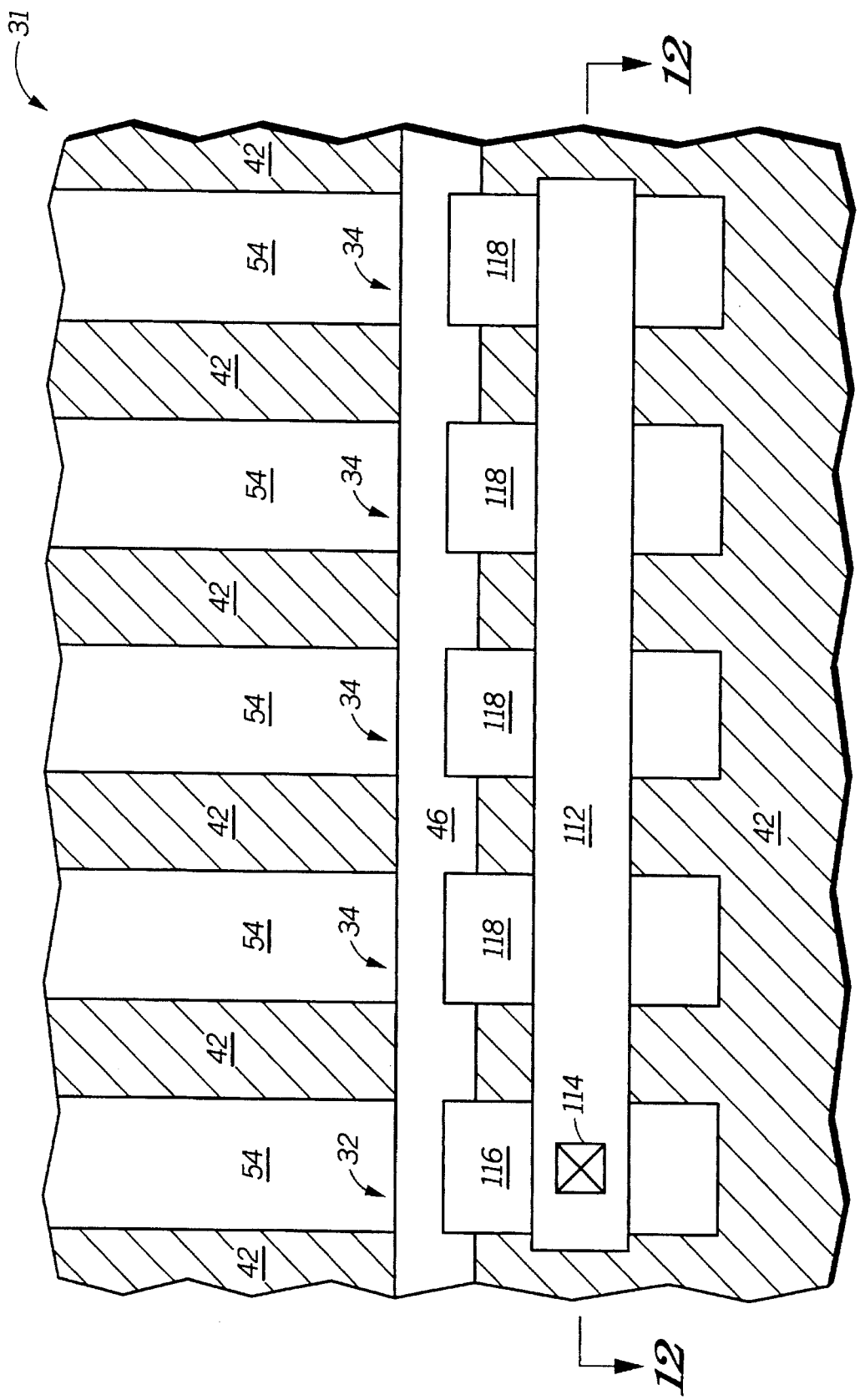

A conductive member 112 is formed within the opening 101. The conductive member 112 extends across most but not all the portion 31 of the NVRAM array as shown in FIG. 11. In FIG. 11, sidewall spacers are not illustrated to better show the positional relationships between the various elements within FIG. 11. Conductive member 112 is part of the drive line segment $DLS_{11}$. Unlike conductive member 46, which is $WL_1$, conductive member 112 does not extend beyond the edges of FIG. 11. Contact 114 is the location where conductive member lies within opening 101 (seen in FIG. 10).

Figure 12:
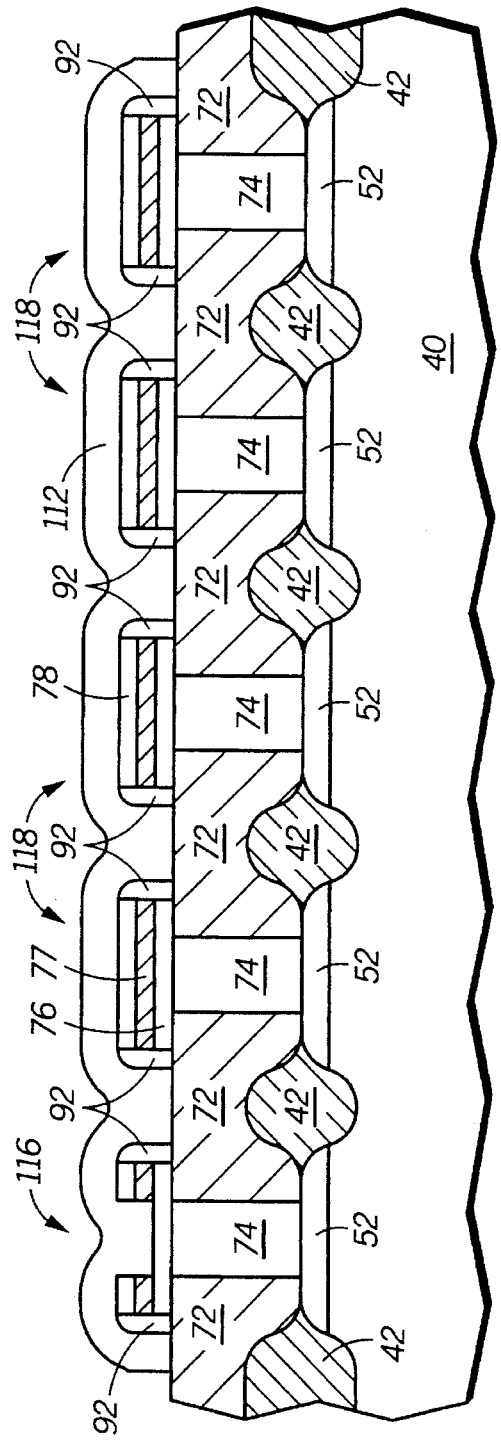
FIGS. 11 and 12 include plan and cross-sectional views, respectively, of the substrate of FIG. 10 after forming a drive line segment.

FIG. 12 includes an illustration as shown by the sectioning lines 12—12 in FIG. 11. As can be seen in FIG. 12, the conductive member 112 electrically connects portions of the conductive members 76 and 78 of the leftmost structure in FIG. 12. The leftmost structure is an electrically shorted capacitor, which is a structure similar to a capacitor but has its electrodes electrically shorted to each other. The combination of the conductive member 112 and the leftmost conductive plug 74 is $DLS_{11}$.

Within the other structures, members 76–78 form the memory capacitors 118. Conductive members 78 are upper electrodes of the memory capacitors 118 and are electrically connected to the source/drain region 52 of the control transistor via conductive member 112 and conductive plug 74. Conductive members 76 are lower electrodes for the memory capacitors 118.

Figure 13:
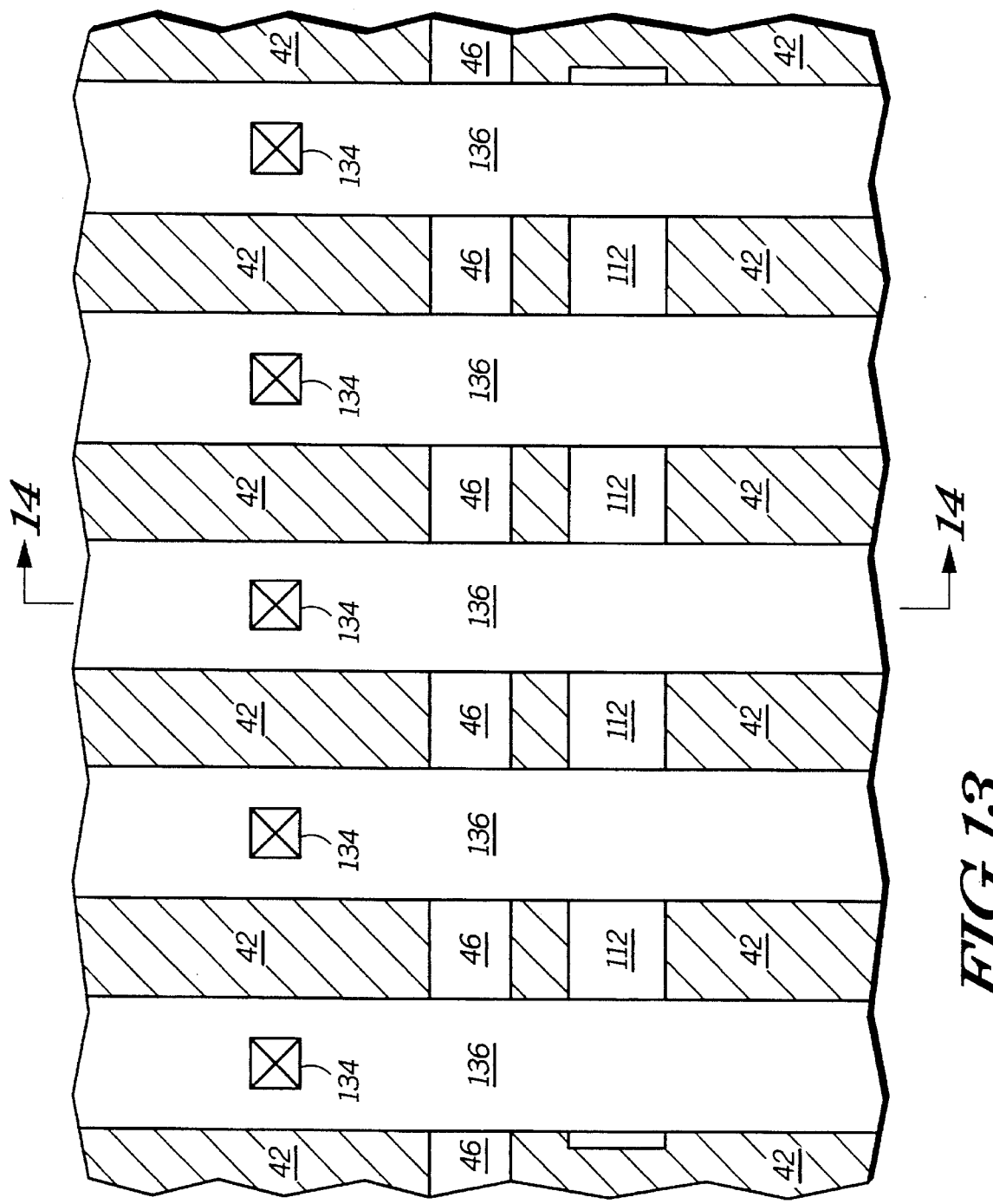
FIGS. 13 and 14 include illustrations of plan and cross-sectional views, respectively, of the substrate of FIG. 12 after forming drive lines and bit lines.
Figure 14:
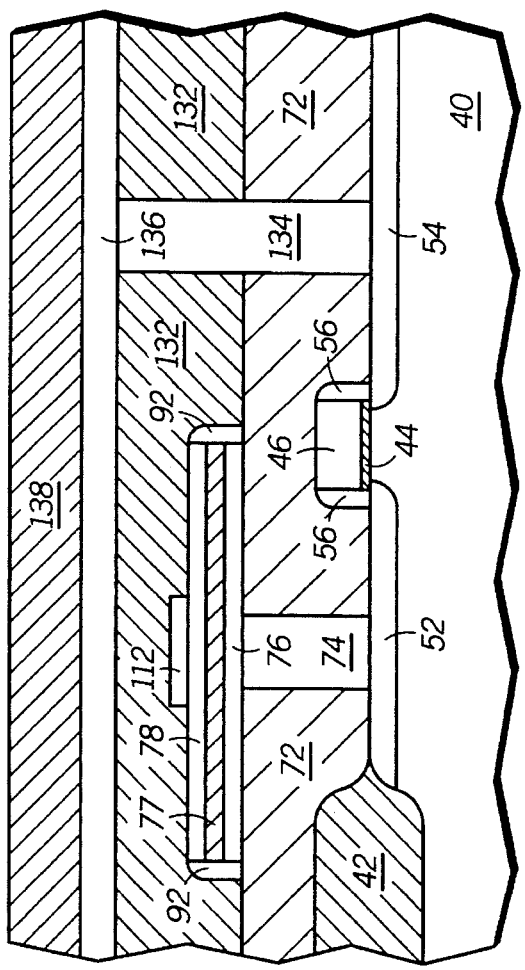

The substrate is further processed to form a substantially completed device as shown in FIGS. 13 and 14. An insulating layer 132 is formed over the substrate including conductive member 112. Openings are formed through insulating layers 72 and 132 and filled with conductive plugs 134. Interconnects 136 are formed over the conductive plugs 134, and a passivation layer 138 is deposited over the interconnects 136. Other layers and electrical connections may be formed but are not shown.

Interconnects 136 extend from top to bottom in FIG. 13. The leftmost interconnect 136 is $DL_1$ as shown in FIG. 3. The other interconnects 136 correspond to the bit lines for that associated drive line including $BL_{11}$, $BL_{12}$, $BL_{13}$, and $BL_{14}$. Again, insulating layers and spacers are not shown in FIG. 13 to better illustrate the positional relationships between the various components of the device.

FIG. 14 includes an illustration of a cross-sectional view at sectioning lines 14—14 in FIG. 13. FIG. 14 includes a memory transistor and its associated memory capacitor. Interconnect 136 is $BL_{12}$ and is electrically connected to source/drain region 54 through conductive plug 134. The conductive member 46 is $WL_1$ for the memory cell. The transistor also includes source/drain region 52 that is electrically connected to the overlying memory capacitor through conductive plug 74. Conductive member 76 is the lower electrode, ferroelectric dielectric member 77 is the capacitor dielectric, and conductive member 78 is the upper electrode for the capacitor. Conductive member 112 contacts conductive member 78 and is $DLS_{11}$. Therefore, FIG. 14 shows a single memory cell that includes a memory transistor and a memory capacitor.

Although only one drive line segment of memory cells was illustrated, the other memory cells along other drive line segments would be formed in a similar manner. The control transistor, memory transistors, and memory capacitors along $DLS_{12}$ would lie below the structures illustrated in 5, 11, and 13. The layout along $DLS_{12}$ would be a mirror image of the layout seen in FIGS. 5, 11, and 13. The control transistor, memory transistors, and memory capacitors along $DLS_{21}$ would lie to the right of the structures illustrated in 5, 11, and 13.

Regardless of the row or column, thousands of memory cells are not directly connected to a drive line. Assuming only $WL_1$ and $DL_1$ are active, only the four memory cells within portion 31 are affected. The other memory cells along $DL_1$ are not affected because $WL_2$ to $WL_N$ are not active. In a conventional NVRAM, a drive line would be electrically connected to thousands of memory capacitors at a single time. Therefore, in a conventional NVRAM, all memory capacitors along $DL_1$ are affected when the potential on $DL_1$ is changed, whereas only as few as four capacitors along a drive line segment (i.e., $DLS_{11}$) are affected in the embodiment described above. Referring to FIG. 3, memory cells associated with $DLS_{11}$ and $DLS_{21}$ lie along the same row, but are controlled by different drive lines and have separate control transistors.

Other Embodiments

Figure 15:
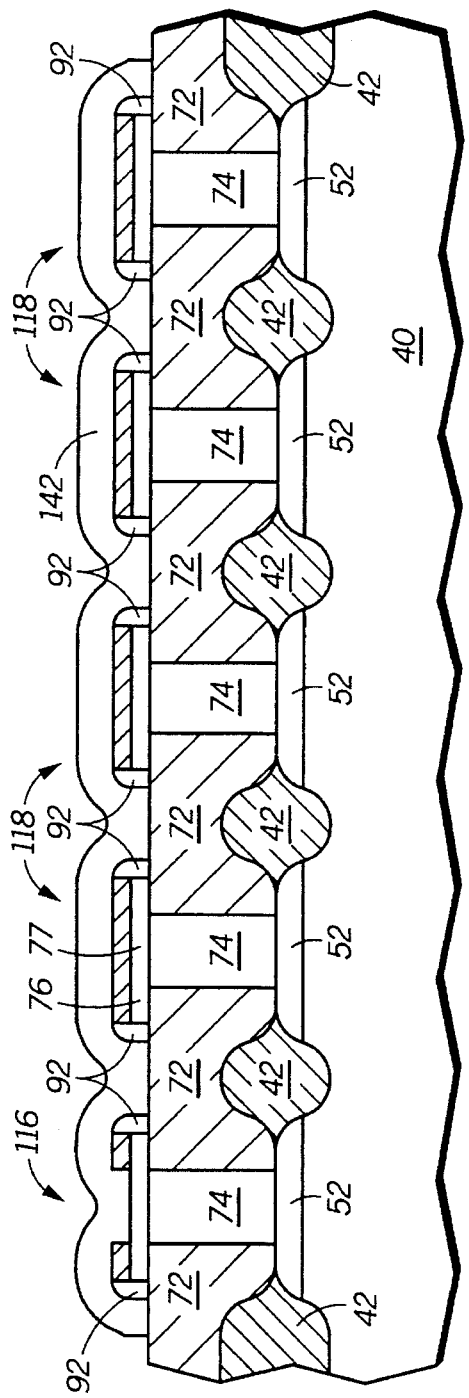

FIG. 15 includes an illustration of another embodiment of the present invention. In FIG. 15, the conductive layer 78 is eliminated. After forming the ferroelectric layer, the conductive and ferroelectric layers are patterned to form conductive and ferroelectric dielectric members 76 and 77. Sidewall spacers 92 are then formed adjacent to the structures and an opening is formed through the ferroelectric member 77 for the leftmost structure in FIG. 15. A conductive member 142 is then formed over the structures as shown in FIG. 15. The conductive member 142 is part of $DLS_{11}$ and is the upper electrodes for the capacitors 116 and 118. FIG. 15 is virtually identical to FIG. 12 except that members 78 are not present. Unlike FIG. 14, conductive member 142 of this embodiment is at least as wide at member 78 in FIG. 14 instead of the width of conductive member 112.

FIG. 16 illustrates yet another embodiment. In this particular embodiment, the ferroelectric and conductive members 77 and 78 are removed over the leftmost source/drain region 52. Also, openings are formed through layer 72 and members 76–78 to the source/drain regions 52, as shown in FIG. 16. For the memory cells, insulating sidewall spacers 92 and 152 are then formed along edges of the structures and along the inner walls or the openings, respectively.

Unlike previous embodiments, an electrically shorted capacitor is not formed. In this particular embodiment conductive member 76 is part of $DLS_{11}$ and is electrically connected to the leftmost source/drain region 52 by conductive plug 156. Note that conductive member 76 was patterned such that it does not extend beyond the edges of FIG. 15. Conductive plugs 154 electrically connect the source/drain regions 52 of the memory transistors with the conductive members 78, which are the upper electrodes of the memory capacitors.

FIG. 17 includes yet another embodiment in which the conductive member 76 also is part of $DLS_{11}$. In this particular embodiment, a structure similar to those described for FIG. 16 is formed over the leftmost source/drain region 52. After forming the structure, a layer is then deposited that fills up the openings and overlies a portion of the conductive members 78. The layer is patterned to form conductive plugs 154 and 166. Conductive plug 166 is similar to conductive plugs 154 except that 166 is wider to electrically connect conductive members 76 and 78, thereby forming an electrically shorted capacitor.

Benefits

The present invention allows an efficient way of coupling a drive line to a drive line segment for a stacked capacitor NVRAM array (FIGS. 12 and 15) and for a space efficient capacitor NVRAM array (FIGS. 16 and 17). The drive line segment is not made via a strap from a source/drain region to a separate conductive member that does not overlie the source/drain region. For example, referring to FIG. 2, it is seen that the drive line 26 does not overlie any portion of the source region of the memory capacitor. Because of the space efficiency of the present invention, more cells can be formed within a smaller amount of space and can be done so without any tremendous process complexities.

Figure 1:
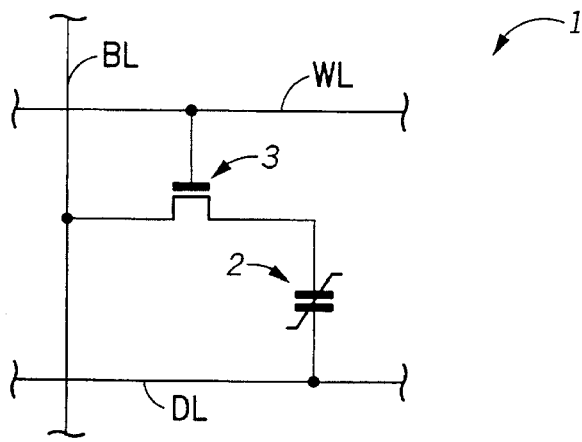
FIG. 1 includes an illustration of a circuit diagram of a nonvolatile random access memory cell (prior art)
Figure 2:
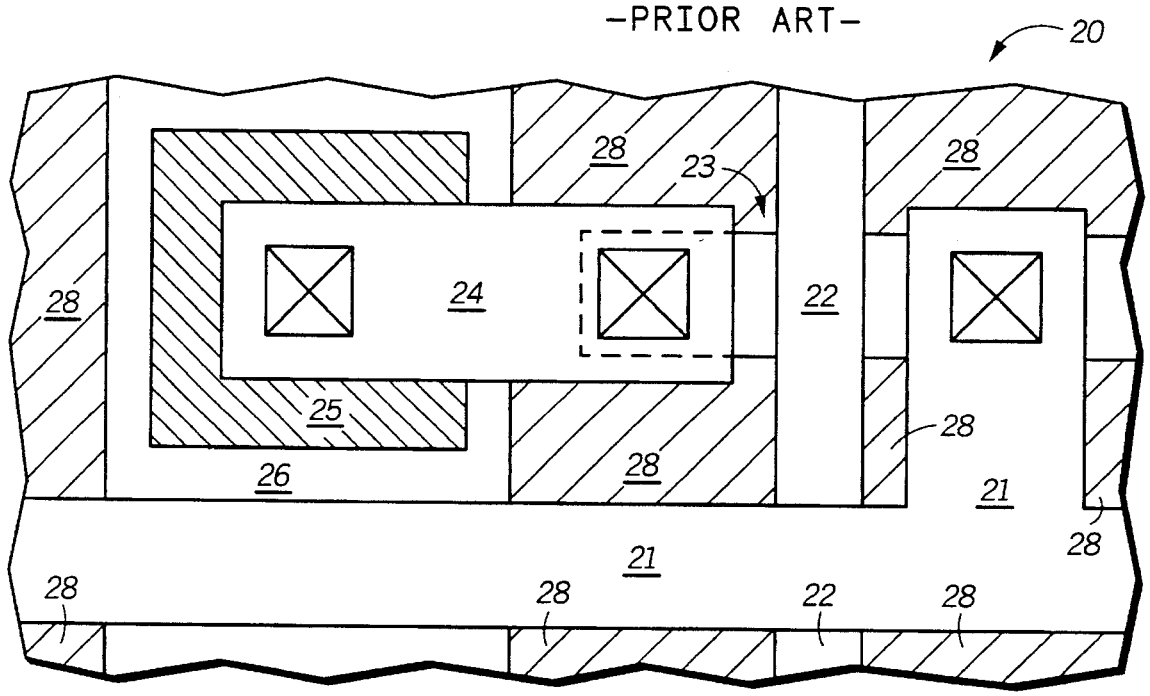
FIG. 2 includes an illustration of a plan view of a nonvolatile memory cell.

The present invention allows a memory cell and memory array to be decreased in size. In this case, the drive lines and bit lines overlie the source/drain regions and ferroelectric capacitor as shown in FIGS. 13 and 14. Compare this to the strapped capacitor as shown in FIG. 2.

In the foregoing specification, the invention has been described with reference to specific embodiments thereof. However, it will be evident that various modifications and changes can be made thereto without departing from the scope of the invention as set forth in the appended claims. Accordingly, the specification and drawings are to be regarded in an illustrative rather than a restrictive sense.

I claim:

1. A process for forming a nonvolatile random access memory array having memory cells comprising the steps of:

forming a control transistor and a memory transistor, wherein each of the control and memory transistors includes a source/drain region;

forming an insulating layer over the control and memory transistors;

forming openings in the insulating layer over the source/drain regions of the control and memory transistors;

forming a first capacitor electrode over the source/drain region of the memory transistor; and forming a conductive member that overlies the source/drain region of the memory transistor and is electrically connected to the source/drain region of the control transistor.

2. The process of claim 1, further comprising a step of forming a second capacitor electrode over the first capacitor electrode before the step of forming the conductive member.

3. The process of claim 2, wherein:

the step of forming the first capacitor electrode forms another first capacitor electrode that overlies the source/drain region of the control transistor;

the step of forming the second capacitor electrode forms another second capacitor electrode that overlies the another first capacitor electrode; and the step of forming the conductive member is performed such that the conductive member is electrically connected to the another first capacitor electrode and the another second capacitor electrode.

4. The process of claim 1, further comprising a step of forming a conductive plug that is electrically connected to the source/drain region of the memory transistor and the first capacitor electrode.

5. The process of claim 4, further comprising a step of forming a second capacitor electrode over the first capacitor electrode before the step of forming the conductive member, wherein:

the step of forming the first capacitor electrode forms another first capacitor electrode that overlies the source/drain region of the control transistor;

the step of forming the second capacitor electrode forms another second capacitor electrode that overlies the another first capacitor electrode; and the step of forming the forming the conductive member is performed such that the conductive member is electrically connected to the another first capacitor electrode and the another second capacitor electrode.

6. The process of claim 4, wherein the step of forming the conductive plug forms another conductive plug that overlies the source/drain region of the control transistor and is electrically connected to the source/drain region of the control transistor and the conductive member.

7. The process of claim 1, further comprising a step of forming a conductive plug that is electrically connected to the source/drain region of the control transistor and the conductive member.

8. The process of claim 1, wherein the conductive member is part of a drive line segment.

9. The process of claim 1, wherein:

the step of forming the control and memory transistors forms at least one other memory transistor having a source/drain region;

the step of forming the insulating layer is performed such that the insulating layer overlies the at least one other memory transistor;

the step of forming the openings forms at least one other opening in the insulating layer, wherein the at least one other opening overlies the source/drain region of the at least one other memory transistor;

the step of forming a first capacitor electrode forms at least one other first capacitor electrode over the source/drain region of the at least one other memory transistor; and the step of forming the conductive member is performed such that the conductive member overlies the source/drain region of the at least one other memory transistor.

10. The process of claim 9, wherein:

the memory array has an organization of n bits;

the memory array has a first plurality of the memory cells;

the first plurality of the memory cells consists of n memory cells; and the step of forming the conductive member is performed such that the conductive member is electrically connected to the memory cells of the first plurality of the memory cells and no other memory cells.

11. The process of claim 9, wherein:

each memory cell includes at least one of the memory transistors and its corresponding memory capacitor;

the memory array includes a first plurality of the memory cells and a second plurality of the memory cells;

none of the memory cells belong to both the first and second pluralities of the memory cells;

the first and second pluralities of the memory cells are oriented along a same row or a same column; and the step of forming the conductive member is performed such that the conductive member is electrically connected to the first plurality of the memory cells but not the second plurality of the memory cells.

12. A process for forming a nonvolatile random access memory array having memory cells comprising the steps of:

forming a control transistor and a memory transistor, wherein each of the control and memory transistors includes a source/drain region;

forming an insulating layer over the control and memory transistors;

forming openings in the insulating layer over the source/drain regions of the control and memory transistors;

forming first capacitor electrodes over the source/drain regions of the control and memory transistor;

forming a ferroelectric layer; and forming a conductive member that overlies the source/drain region of the control and memory transistors, wherein the conductive member is electrically connected to the source/drain region of the control transistor and the first capacitor electrode that overlies the source/drain region of the control transistor thereby forming an electrically shorted capacitor.

13. The process of claim 12, wherein the conductive member is part of a drive line segment.

14. The process of claim 12, further comprising a step of forming second capacitor electrodes over the ferroelectric layer before the step of forming the conductive member.

15. The process of claim 12, further comprising a step of forming a conductive plug that is electrically connected to the source/drain region of the memory transistor and the first capacitor electrode that overlies the memory transistor.

16. The process of claim 15, wherein the step of forming the conductive plug forms another conductive plug that overlies the source/drain region of the control transistor and is electrically connected to the source/drain region of the control transistor and the conductive member.

17. The process of claim 12, wherein:

the step of forming the control and memory transistors forms at least one other memory transistor having a source/drain region;

the step of forming the insulating layer is performed such that the insulating layer overlies the at least one other memory transistor;

the step of forming the openings forms at least one other opening in the insulating layer, wherein the at least one other opening overlies the source/drain region of the at least one other memory transistor;

the step of forming the first capacitor electrodes forms at least one other first capacitor electrode over the source/drain region of the at least one other memory transistor; and the step of forming the conductive member is performed such that the conductive member overlies the source/drain region of the at least one other memory transistor.

18. The process of claim 17, wherein:

each memory cell includes at least one of the memory transistors and its corresponding memory capacitor;

the memory array includes a first plurality of the memory cells and a second plurality of the memory cells;

none of the memory cells belong to both the first and second pluralities of the memory cells;

the first and second pluralities of the memory cells are oriented along a same row or a same column; and the step of forming the conductive member is performed such that the conductive member is electrically connected to the first plurality of the memory cells but not the second plurality of the memory cells.

19. The process of claim 17, wherein:

the memory array has an organization of n bits;

the memory array has a first plurality of the memory cells;

the first plurality of the memory cells consists of n memory cells; and the step of forming the conductive member is performed such that the conductive member is electrically connected to the memory cells of the first plurality of the memory cells and no other memory cells.

* * * * *